(12) United States Patent
Nojima

(10) Patent No.: US 10,017,669 B2
(45) Date of Patent: Jul. 10, 2018

(54) POLISHING COMPOSITION, POLISHING METHOD, AND METHOD FOR PRODUCING POLISHING COMPOSITION

(71) Applicant: SHIN-ETSU CHEMICAL CO., LTD., Tokyo (JP)

(72) Inventor: Yoshihiro Nojima, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 18 days.

(21) Appl. No.: 15/122,595

(22) PCT Filed: Feb. 4, 2015

(86) PCT No.: PCT/JP2015/000490
§ 371 (c)(1),
(2) Date: Aug. 30, 2016

(87) PCT Pub. No.: WO2015/136832
PCT Pub. Date: Sep. 17, 2015

(65) Prior Publication Data
US 2017/0096584 A1    Apr. 6, 2017

(30) Foreign Application Priority Data

Mar. 11, 2014    (JP) .................................. 2014-047399

(51) Int. Cl.
| | | |
|---|---|---|
| C09G 1/02 | (2006.01) | |
| C09K 3/14 | (2006.01) | |
| H01L 21/321 | (2006.01) | |

(52) U.S. Cl.
CPC .............. *C09G 1/02* (2013.01); *C09K 3/1409* (2013.01); *C09K 3/1463* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 4,944,836 A | 7/1990 | Beyer et al. | |
| 6,464,740 B1 | 10/2002 | Towery et al. | |
| 2006/0013752 A1 | 1/2006 | Lee et al. | |
| 2006/0065939 A1 | 3/2006 | Doczy et al. | |
| 2008/0153292 A1* | 6/2008 | White | C09G 1/02 438/692 |
| 2010/0056026 A1 | 3/2010 | Shirota et al. | |
| 2012/0214307 A1 | 8/2012 | Yoshikawa et al. | |
| 2012/0252213 A1* | 10/2012 | Singh | C09G 1/02 438/693 |
| 2013/0109194 A1 | 5/2013 | Shirota et al. | |
| 2013/0320595 A1 | 12/2013 | Nagare | |
| 2014/0209566 A1* | 7/2014 | Fu | C09G 1/02 216/53 |

FOREIGN PATENT DOCUMENTS

| | | |
|---|---|---|
| CN | 101568615 A | 10/2009 |
| CN | 102686360 A | 9/2012 |
| JP | H06-40726 A | 2/1994 |
| JP | H07-77218 B2 | 8/1995 |
| JP | H10-310766 A | 11/1998 |
| JP | 2000-080352 A | 3/2000 |
| JP | 2005-126253 A | 5/2005 |
| JP | 2006-032966 A | 2/2006 |
| JP | 2007-031176 A | 2/2007 |
| JP | 2008-515190 A | 5/2008 |
| JP | 2008-137884 A | 6/2008 |
| JP | 2009-163808 A | 7/2009 |
| JP | 2010-016064 A | 1/2010 |
| JP | 2012-153588 A | 8/2012 |
| JP | 2013-018690 A | 1/2013 |
| WO | 2008/081943 A1 | 7/2008 |
| WO | 2011/058816 A1 | 5/2011 |
| WO | 2012/114923 A1 | 8/2012 |

OTHER PUBLICATIONS

May 12, 2015 International Search Report issued in International Patent Application No. PCT/JP2015/000490.
Sep. 13, 2016 International Preliminary Report on Patentability issued in International Patent Application No. PCT/JP2015/000490.
May 3, 2017 Office Action issued in Chinese Patent Application No. 201580012677.X.
Dec. 6, 2016 Office Action issued in Japanese Patent Application No. 2014-047399.
Mar. 16, 2018 Office Action issued in Taiwanese Application No. 104107564.

* cited by examiner

*Primary Examiner* — Allan Olsen
(74) *Attorney, Agent, or Firm* — Oliff PLC

(57) ABSTRACT

A polishing composition includes crystalline metal oxide particles as abrasive grains, wherein the full width at half maximum of a peak portion having the maximum diffracted intensity in an X-ray powder diffraction pattern of the metal oxide particles is less than 1°. Thus, a polishing composition and a polishing method have high polishing speed and suppress defect generation such as a scratch and dishing, which causes to degrade reliability of a semiconductor apparatus in a polishing process of a semiconductor substrate, particularly in a chemical mechanical polishing process of a semiconductor substrate with a metal layer having tungsten, etc.; and a method produces the polishing composition.

12 Claims, 1 Drawing Sheet

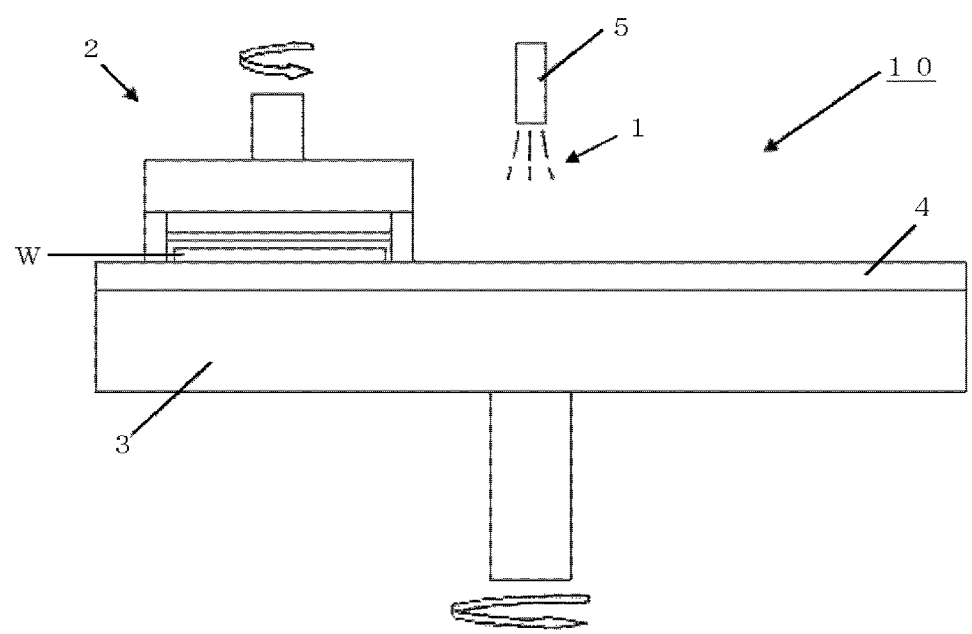

POLISHING COMPOSITION, POLISHING METHOD, AND METHOD FOR PRODUCING POLISHING COMPOSITION

TECHNICAL FIELD

The present invention relates to a polishing composition, a polishing method, and a method for producing a polishing composition.

BACKGROUND ART

As the improvement on production technology for semiconductor integrated circuits, high integration and high-speed performance of semiconductor devices are demanded. Accordingly, since stricter flatness is demanded for the surfaces of semiconductor substrates in production processes of fine circuits in semiconductor devices, Chemical Mechanical Polishing (CMP) has been an essential technology for production processes of semiconductor devices.

This CMP is used for a wiring process in which grooves formed on an insulation layer of a semiconductor substrate is filled with metal material such as tungsten, copper, or aluminum, and the metal layer piled at groove portions are polished and removed (see Patent Document 1). In recent semiconductor memory devices, it has been investigated to use metal material for device portions such as gate electrodes, too, in order to further improve the performances. CMP is used in the production process of this semiconductor memory device as well (see Patent Document 2).

In CMP, a semiconductor substrate is pressed against a polishing pad attached onto a turn table, while the polishing pad is made to move relatively as the polishing pad is supplied with a polishing composition containing abrasive grains and a reagent. In this process, it is possible to grind unevenness on the surface of the semiconductor substrate on the basis of a chemical reaction due to the reagent and a mechanical polishing effect due to the abrasive grains to flatten the surface. As the abrasive grains contained in a polishing composition, inorganic particles of silicon dioxide, aluminum oxide, silicon carbide, diamond, titanium oxide, zirconium oxide, cerium oxide, manganese oxide, and so on are used (see Patent Documents 3 and 4).

In CMP process, important characteristics are polishing speed and defects due to polishing process such as a scratch and dishing, which is a concave on a buried pattern portion. Since polishing speed relates to productivity in a semiconductor producing process, and productivity influences to the cost of a semiconductor device, higher polishing speed is required. On the other hand, since defects influence to the yield and reliability of a semiconductor device, the problem is how to suppress defect generation in a CMP process. As described above, a polishing process on a higher level comes to be demanded in accordance with miniaturization of semiconductor devices.

CITATION LIST

Patent Literature

Patent Document 1: Japanese Examined Patent publication (Koukoku) No. H7-77218
Patent Document 2: Japanese Unexamined Patent Application publication (Translation of PCT Application) No. 2008-515190
Patent Document 3: Japanese Unexamined Patent publication (Kokai) No. H10-310766
Patent Document 4: Japanese Unexamined Patent publication (Kokai) No. 2000-080352

SUMMARY OF INVENTION

Technical Problem

In accordance with miniaturization of semiconductor devices, however, the conventional polishing technologies come to be unable to sufficiently meet the characteristics of polishing speed and defects to be required. Accordingly, it has been demanded polishing technology with high polishing speed and can further improve the characteristics on defects such as a scratch and dishing.

The present invention was accomplished in view of the above-described problems. It is an object of the present invention to provide a polishing composition and a polishing method which have high polishing speed and can suppress defect generation such as a scratch and dishing, which causes to degrade reliability of a semiconductor apparatus, in a polishing process of a semiconductor substrate, particularly in a chemical mechanical polishing process of a semiconductor substrate with a metal layer such as tungsten, etc.; and a method for producing the polishing composition

Solution to Problem

To achieve the foregoing object, the present invention provides a polishing composition, comprising crystalline metal oxide particles as abrasive grains, wherein the full width at half maximum of a peak portion having the maximum diffracted intensity in an X-ray powder diffraction pattern of the metal oxide particles is less than 1°.

As described above, the polishing composition containing highly-crystalline metal oxide particles in which the full width at half maximum at a peak portion of diffracted intensity in an X-ray powder diffraction pattern is less than 1° as abrasive grains can have high polishing speed and can suppress defect generation such as a scratch and dishing thereby.

The average particle size of the metal oxide particles is preferably 10 nm or more and 100 nm or less.

The metal oxide particles with the average particle size of 10 nm or more do not lower polishing speed extremely. When the average particle size is 100 nm or less, generation of a scratch can be prevented.

The metal oxide particles can contain any one of metal oxide selected from the group consisting of titanium oxide, zirconium oxide, cerium oxide, aluminum oxide, and manganese oxide; a mixture of two or more of these metal oxides; or a complex oxide containing at least one of these metal oxides.

As metal oxide used in the present invention, metal oxide particles containing thereof are suitable.

It is preferable that this polishing composition further comprise an oxidizing agent.

By containing an oxidizing agent, it is possible to oxidize the surface of a semiconductor substrate, and to promote polishing effectively thereby.

As the oxidizing agent, it is preferable to comprise at least one variety selected from the group consisting of peroxides and iron(III) salts.

It is preferred that the peroxide comprise at least one variety selected from the group consisting of persulfuric acid, periodic acid, perchloric acid, salts thereof, and hydrogen peroxide.

It is preferred that the iron(III) salt comprises at least one variety selected from the group consisting of iron(III) sulfate, iron(III) nitrate, iron(III) chloride, iron(III) oxalate, potassium tris(oxalate)ferrate(III), ammonium hexacyanoferrate(III), potassium hexacyanoferrate(III), iron(III) citrate, ammonium iron(III) citrate, and water-soluble ferrocene derivatives.

By containing these types of an oxidizing agent, it is possible to oxidize the surface of a semiconductor substrate, and to promote polishing effectively thereby.

The content of the metal oxide particles is preferably 0.1% by mass or more and 10% by mass or less.

When the content of the metal oxide particles is 0.1% by mass or more, sufficient polishing speed can be obtained. When the content of the metal oxide particles is 10% by mass or less, generation of a scratch can be suppressed.

The inventive polishing composition can further comprise at least one of a dispersant and a pH adjuster.

Such a polishing composition possesses a property and pH to meet the object to be polished or the purpose.

The present invention also provides a polishing method, wherein a semiconductor substrate is polished by using the foregoing polishing composition to achieve the foregoing object.

Using the foregoing polishing composition, it is possible to polish a semiconductor substrate in high polishing speed, and to suppress generation of a scratch and dishing.

It is preferred that the semiconductor substrate contain a metal layer.

The present invention is suitable for polishing a semiconductor substrate containing a metal layer.

The metal layer preferably comprises tungsten or tungsten alloy.

The present invention is particularly suitable for polishing a semiconductor substrate containing tungsten or tungsten alloy as the metal layer.

The present invention also provides a method for producing the polishing composition, comprising the steps of:
measuring a full width at half maximum of a peak portion having the maximum diffracted intensity of the metal oxide particles by an X-ray powder diffraction method,
adding the metal oxide particles in which the measured full width at half maximum is less than 1° to the polishing composition as the abrasive grains.

By sorting metal oxide particles in which the full width at half maximum is less than 1°, and then loading thereof as the abrasive grains into the polishing composition used for polishing such as CMP, it is possible to obtain a polishing composition which has high polishing speed and can suppress generation of a scratch and dishing.

Advantageous Effects of Invention

The present invention can maintain high polishing speed and can suppress defect generation such as a scratch and dishing in a polishing process of a semiconductor substrate, particularly in CMP of a semiconductor substrate with a metal layer comprising tungsten, etc.

BRIEF DESCRIPTION OF DRAWINGS

FIG. 1 is a schematic diagram to show an example of a single-side polishing apparatus which can be used for a polishing method of the present invention.

DESCRIPTION OF EMBODIMENTS

Hereinafter, the embodiments of the present invention will be described, but the present invention is not limited thereto.

As described above, lowering of defects such as a scratch and dishing in polishing such as CMP comes to be highly demanded in accordance with miniaturization of semiconductor devices. There has also been a problem that lowering of polishing speed have to be suppressed in addition to the lowering of defects.

Accordingly, the present inventors have specifically investigated to solve such problems, and consequently have conceived that the subjects can be attained by loading a polishing composition with highly-crystalline metal oxide, specifically, metal oxide in which the full width at half maximum of a peak portion having the maximum diffracted intensity measured by an X-ray powder diffraction pattern is less than 1° as abrasive grains; thereby completing the present invention.

Hereinafter, the present invention will be described specifically.

First, the inventive polishing composition will be described.

The inventive polishing composition contains highly-crystalline metal oxide in which the full width at half maximum of a main peak in diffracted intensity measured by an X-ray powder diffraction is less than 1°.

This full width at half maximum can be determined on the basis of an X-ray pattern obtained by a θ-2θ method using Cu-Kα ray, which has a wavelength of 1.5418 (angstroms), as an X-ray source, for example. The full width at half maximum means a peak width of the peak having the maximum intensity at a position in which the intensity is half of the peak intensity with the background being excluded therefrom.

When metal oxide particles with the full width at half maximum being less than 1° is used as described above, characteristics of polishing speed and defects such as a scratch and dishing are more favorable compared to the case using metal oxide particles with the full width at half maximum being 1° or more. Although the specific mechanism is unknown at present, it is supposed that this is due to the practical hardness of the metal oxide particles or chemical interaction between the surface of the metal oxide particles and the surface of an object to be polished.

In the present invention, the crystal structure of the metal oxide is not particularly limited. It can have a single crystal phase or plural of crystal phases so long as the full width at half maximum is less than 1°. The metal oxide may be a complex oxide, and can be appropriately selected in accordance with an object to be polished or a purpose.

As the metal oxide, any one of metal oxide selected from the group consisting of titanium oxide, zirconium oxide, cerium oxide, aluminum oxide, and manganese oxide; or a mixture of two or more of these metal oxides is suitable.

The complex oxide is suitably a complex oxide which contains any one of metal oxide selected from the group consisting of titanium oxide, zirconium oxide, cerium oxide, aluminum oxide, and manganese oxide.

Illustrative examples of the complex oxide include zirconia/ceria complex oxide, alumina/ceria complex oxide, zirconia/yttria complex oxide, and iron/manganese complex oxide, but is not limited thereto.

In the polishing composition, the average particle size (primary particle size) of the metal oxide particles is preferably 10 nm or more and 100 nm or less.

When the average particle size of the metal oxide particles is 10 nm or more, the polishing speed is not lowered extremely. When the average particle size is 100 nm or less, the particles are not too large, and a scratch is hard to generate thereby.

The average particle size of the metal oxide can be calculated from an average value of maximum of unidirectional diameters, i.e. Feret diameters, of 100 or more of the particles subsequent to measure the particle images obtained by Transmission Electron Microscope (TEM) or Scanning Electron Microscope (SEM). Naturally, the measuring method of the average particle size is not limited thereto, and it is possible to measure by other methods.

The inventive polishing composition may further comprise an oxidizing agent in addition to the metal oxide.

This oxidizing agent is not particularly limited, but it is preferable to be an organic or inorganic compound composed of peroxide or an iron(III) salt.

As the peroxide, though it is not particularly limited, it is preferable to contain peracetic acid, periodic acid, perchloric acid, or hydrogen peroxide. As the compound composed of an iron(III) salt, though it is not particularly limited, it is preferable to contain iron(III) sulfate, iron(III) nitrate, iron (III) chloride, iron(III) oxalate, potassium tris(oxalate)ferrate(III), ammonium hexacyanoferrate(III), potassium hexacyanoferrate(III), iron(III) citrate, ammonium iron(III) citrate, or a water-soluble ferrocene derivative.

When the inventive polishing composition contains such an oxidizing agent, it is possible to oxidize the surface of a semiconductor substrate, and to promote polishing effectively thereby.

The content of the metal oxide particles of the polishing composition is preferably 0.1% by mass or more and 10% by mass or less, more preferably 0.3% by mass or more and 3% by mass or less.

When the content of the metal oxide is 0.1% by mass or more, sufficient polishing speed can be obtained. When the content of the metal oxide is 10% by mass or less, a scratch is hard to generate.

It is preferred that the inventive polishing composition further comprise at least one of a dispersant and a pH adjuster.

As the dispersant, a water-soluble polymer can be added, for example. The type, the structure, and the molecular weight of the water-soluble polymer is not particularly limited, and it is possible to appropriately select previously known ones in accordance with the needs. Illustrated examples of the water-soluble polymer include polycarboxylic acids, polysulfonic acids, polyacrylic acids, polyvinylpyrrolidone, polyamines, and polyimines, but is not limited thereto.

As the pH adjuster, it is possible to use an inorganic acid such as nitric acid, hydrochloric acid, or sulfuric acid; an organic acid such as acetic acid, oxalic acid, or succinic acid; an inorganic base such as potassium hydroxide or ammonia; or an organic base such as Tetramethylammonium hydroxide (TMAH).

In a polishing composition of the present invention, the pH is not particularly limited, and can be appropriately selected in accordance with an object to be polished and the purpose. For example, when polishing the surface of a semiconductor substrate containing tungsten or tungsten alloy, the pH of the polishing composition is preferably 1 or more and 6 or less.

Then, the inventive method for producing a polishing composition will be described.

In the present invention, the method for producing highly-crystalline metal oxide particles is not particularly limited, and can be appropriately selected in accordance with the needs.

Illustrative examples thereof include a method to obtain a highly-crystalline metal oxide by pyrolyzing a precursor of the metal oxide formed by precipitation method and so on (see Japanese Unexamined Patent publication No. 2006-32966), a sol-gel method by hydrolysis of metal alkoxide (see Japanese Unexamined Patent publication No. 2013-18690), a spray decomposition method in which metal chloride gas or metal salt is sprayed and decomposed by heat or plasma (see Japanese Unexamined Patent publication No. H6-40726), a hydrothermal crystallization method in which metal salt solution is reacted in a supercritical state water (see Japanese Unexamined Patent publication No. 2008-137884), and a laser ablation method in which target material is irradiated with laser to be evaporated instantaneously and reaggregated (see WO 2012/114923).

As a method for producing a high-crystalline metal oxide particle, the following are known: a method to react oxide of titanium or zinc with Ba and so on in an aqueous alkaline metal hydroxide solution with 10 molar concentration or more (see Japanese Unexamined Patent publication No. 2007-31176) or a heat treatment method of metal oxide sol and metal salt by increasing temperature in a flow reaction apparatus (see Japanese Unexamined Patent publication No. 2012-153588). These production method or producing condition can be appropriately selected to control the crystallinity of metal oxide in accordance with the needs.

The inventive method for producing a polishing composition comprises a step of measuring a full width at half maximum of a peak portion having the maximum diffracted intensity of the produced metal oxide particles by an X-ray powder diffraction method.

The inventive method for producing a polishing composition further comprises a step adding the metal oxide particles in which the measured full width at half maximum is less than 1° as the abrasive grains after measuring the full width at half maximum to produce the polishing composition. It is to be noted that the full width at half maximum is not necessary to be measured at each production of metal oxide particles. When the full width at half maximum is once measured to find and select a condition to make the full width at half maximum less than 1°, it is possible to produce the metal oxide particles afterward by the same condition as the selected condition.

As described above, in the present invention, it is possible to securely produce a polishing composition which can realize high-speed polishing and low defect by loading the polishing composition with the highly-crystalline metal oxide in which the full width at half maximum is less than 1° as the abrasive grains.

It is possible to comprise the step(s) to add the foregoing oxidizing agent, dispersant, pH adjuster, and so on to the polishing composition.

Subsequently, the polishing method by using the inventive polishing composition will be described. Hereinafter, it will be described with referring to an example to perform single-side polishing of a semiconductor substrate, but the present invention is not limited thereto naturally. It is possible to use the inventive polishing composition to double-side polishing or polishing of a chamfer.

The single-side polishing apparatus can be a single-side polishing apparatus 10 composed of a turn table 3 attached with a polishing pad 4, a polishing composition supply mechanism 5, a polishing head 2, and so on as described in FIG. 1, for example.

In such a polishing apparatus 10, a semiconductor substrate W is held by the polishing head 2, while supplying the inventive polishing composition 1 onto the polishing pad 4 through the polishing composition supply mechanism 5, each of the turn table 3 and the polishing head 2 is rotated, and the surface of the semiconductor substrate W is brought into contact with the polishing pad 4 to perform polishing.

In this case, the semiconductor substrate W can contain a metal layer, and the metal layer can comprise tungsten or tungsten alloy.

The inventive polishing method is suitable for polishing a surface containing a metal layer as an object to be polished, and is suitably used for polishing a metal layer composed of tungsten or tungsten alloy.

The polishing method using the inventive polishing composition realizes high speed polishing, and can suppress generation of a defect such as a scratch and dishing on a polished semiconductor substrate.

EXAMPLE

Hereinafter, the present invention will be more specifically described with reference to Examples and Comparative Examples, but the present invention is not limited thereto.

Example 1

First, the surface of a semiconductor substrate was subjected to single-side polishing while supplying the inventive polishing composition, and then the polishing speed and occurrence of scratches are evaluated.

The polishing composition used in this single-side polishing was produced as follows.

First, titanium oxide with the crystal structure being anatase structure, the full width at half maximum by X-ray being 0.4322°, and the average particle size being 32 nm was dispersed into pure water so as to have the content of 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

In this case, the full width at half maximum was measured with RINT2500 manufactured by Rigaku Corporation under the condition with the receiving slit size of 0.3 mm, the tube voltage of 50 kV, the tube current of 60 mA, the scan speed of 3°/min, and the sampling width of 0.024°.

The semiconductor substrate to be polished was a blanket substrate in which about 800 nm of a tungsten layer had been deposited through a titanium nitride layer with a thickness of about 10 nm onto s silicon substrate with a diameter of 12 inches (300 mm).

As the evaluation of the polishing speed, a change of each thickness of the tungsten layers (film thicknesses) before and after the polishing was divided by time (min) to calculate a polishing speed. The film thickness was determined by the following (equation 1) on the basis of a seat resistivity measured with 4-point prove resistivity measuring instrument (RH-100PV manufactured by NAPSON CORPORATION).

$$\rho = \rho_s \times t \quad \text{(equation 1)}$$

(wherein, $\rho$ is a resistivity (constant), $\rho_s$ is a seat resistivity, and t is a film thickness)

As the evaluation of the occurrence of scratches, the number of scratches were counted on the surface of the blanket substrate after polishing by observing arbitrary 10 points near the center of the substrate and arbitrary 10 points near the periphery of the substrate under a laser microscope (1LM21 manufactured by Lasertec Corporation), and the total number of scratches was divided by the total area of the observed region to evaluate the number of scratches per 1 $mm^2$.

The surface of another semiconductor substrate than the foregoing was subjected to single-side polishing to evaluate the dishing amount.

The polishing composition used in this case was the same as the polishing composition produced in the foregoing.

The semiconductor substrate to be polished was a substrate with a pattern in which a tungsten layer with a thickness of about 600 nm had been deposited through a titanium nitride layer with a thickness of about 1 nm into a linear groove with the width of 100 nm and the depth of 200 nm at intervals of 100 nm to bury the groove portion.

To evaluate a dishing amount, the polished pattern portion was cut out, and the section was observed under an electron microscope. The difference between the non-patterned area without a groove and the most depressed portion of the tungsten buried portion was evaluated as a dishing amount.

In Example 1, Poli-762 (manufactured by G&P Technology, Inc.) as the polishing apparatus and IC1000 (Nitta Haas Incorporated) as the polishing pad were used. The single-side polishing was performed under the polishing condition with the loading applied to a substrate to be polished of 193 $g/cm^2$, the rotational speed of the turn table of 70 rpm, the rotational speed of the polishing head of 70 rpm, and the amount of supplied slurry (polishing composition) of 100 mL/min.

Example 2

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, zirconium oxide with the crystal structure being monoclinic structure, the full width at half maximum by X-ray being 0.4169°, and the average particle size being 35 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

Example 3

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, α-aluminum oxide with the crystal structure being triclinic structure, the full width at half maximum by X-ray being 0.8469°, and the average particle size being 58 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

Example 4

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

First, zirconium oxide with the crystal structure being monoclinic structure, the full width at half maximum by X-ray being 0.9108°, and the average particle size being 33 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

Comparative Example 1

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, colloidal silica with an amorphous structure having a broad peak with the full width at half maximum by X-ray being 5° or more, and the average particle size being 54 nm was dispersed into pure water so as to have the content of 1.0% by mass in the polishing composition. Then, 1.5% by mass of hydrogen peroxide and 0.1% by mass of iron(III) nitrate were added and mixed. Subsequently, the pH of the solution was adjusted to 2.5 by nitric acid to produce a polishing composition.

As described above, the polishing composition in Comparative Example 1 was prepared so as not to contain metal oxide with the full width at half maximum being less than 1° as the abrasive grains.

Comparative Example 2

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, titanium oxide with the crystal structure being anatase structure, the full width at half maximum by X-ray being 2.1563°, and the average particle size being 25 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

As described above, the polishing composition in Comparative Example 2 was prepared so as not to contain metal oxide with the full width at half maximum being less than 1° as the abrasive grains.

Comparative Example 3

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, zirconium oxide with the crystal structure being monoclinic structure, the full width at half maximum by X-ray being 1.9254°, and the average particle size being 22 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

As described above, the polishing composition in Comparative Example 3 was prepared so as not to contain metal oxide with the full width at half maximum being less than 1° as the abrasive grains.

Comparative Example 4

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, zirconium oxide with the crystal structure being monoclinic structure, the full width at half maximum by X-ray being 1.1796°, and the average particle size being 29 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

As described above, the polishing composition in Comparative Example 4 was prepared so as not to contain metal oxide with the full width at half maximum being less than 1° as the abrasive grains.

Comparative Example 5

Two kinds of semiconductor substrates were subjected to single-side polishing under the same condition as in Example 1 except for changing the polishing composition to be used, whereby the polishing speed, the occurrence of scratches, and the dishing amount were evaluated by the same method as in Example 1.

In this case, the polishing composition to be used was produced as follows.

First, α-aluminum oxide with the crystal structure being triclinic structure, the full width at half maximum by X-ray being 2.6985°, and the average particle size being 46 nm was dispersed into pure water so as to be 1.0% by mass. Then, 1.5% by mass of hydrogen peroxide and 0.1% by mass of iron(III) nitrate were added and mixed. Subsequently, the pH of the solution was adjusted to 2.5 by nitric acid to produce a polishing composition.

As described above, the polishing composition in Comparative Example 5 was prepared so as not to contain metal oxide with the full width at half maximum being less than 1° as the abrasive grains.

Table 1 shows a summary of the polishing compositions and the evaluation results of Examples and Comparative Examples.

TABLE 1

|  | Abrasive grain | Average particle size (nm) | Crystal structure Full width at half maximum (°) | Polishing speed (Å/min) | Dishing (Å) | Scratch (number/mm$^2$) |
|---|---|---|---|---|---|---|
| Example 1 | Titanium oxide | 32 | Anatase 0.4322 | 2978 | 45 | 0.12 |
| Example 2 | Zirconium oxide | 35 | Monoclinic 0.4169 | 3372 | 51 | 0.16 |
| Example 3 | α-Aluminum oxide | 58 | Triclinic 0.8469 | 3641 | 77 | 0.29 |
| Example 4 | Zirconium oxide | 33 | Monoclinic 0.9108 | 3110 | 80 | 0.24 |
| Comparative Example 1 | Colloidal Silica | 54 | Amorphous ≥5 | 1989 | 126 | 0.40 |
| Comparative Example 2 | Titanium oxide | 25 | Anatase 2.1563 | 2130 | 94 | 0.38 |
| Comparative Example 3 | Zirconium oxide | 22 | Monoclinic 1.9254 | 2353 | 108 | 0.31 |
| Comparative Example 4 | Zirconium oxide | 29 | Monoclinic 1.1796 | 2743 | 91 | 0.33 |
| Comparative Example 5 | α-Aluminum oxide | 46 | Triclinic 2.6985 | 3046 | 117 | 0.64 |

As shown in Table 1, Examples 1 to 4 resulted larger polishing speeds, fewer dishing amounts, and fewer numbers of scratches compared to Comparative Examples.

On the other hand, Comparative Examples 1 to 4 resulted smaller polishing speeds and the largely increased dishing amounts and numbers of scratches compared to Examples.

In Comparative Example 5, although the polishing speed was large, which was the same degree as in Example 1, the dishing amount and the number of scratches were largely increased.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A polishing composition, comprising crystalline metal oxide particles as abrasive grains, wherein
the full width at half maximum of a peak portion having the maximum diffracted intensity in an X-ray powder diffraction pattern of the metal oxide particles is less than 1°, and
the metal oxide particles contain at least one metal oxide selected from the group consisting of titanium oxide and manganese oxide; a mixture of these oxides; or a complex oxide containing at least one of these metal oxides.

2. The polishing composition according to claim 1, wherein the average particle size of the metal oxide particles is 10 nm or more and 100 nm or less.

3. The polishing composition according to claim 1, further comprising an oxidizing agent.

4. The polishing composition according to claim 3, wherein the oxidizing agent comprises at least one variety selected from the group consisting of peroxides and iron(III) salts.

5. The polishing composition according to claim 4, wherein the peroxide comprises at least one variety selected from the group consisting of persulfuric acid, periodic acid, perchloric acid, salts thereof, and hydrogen peroxide.

6. The polishing composition according to claim 4, wherein the iron(III) salt comprises at least one variety selected from the group consisting of iron(III) sulfate, iron(III) nitrate, iron(III) chloride, iron(III) oxalate, potassium tris(oxalate)ferrate(III), ammonium hexacyanoferrate(III), potassium hexacyanoferrate(III), iron(III) citrate, ammonium iron(III) citrate, and water-soluble ferrocene derivatives.

7. The polishing composition according to claim 1, wherein the content of the metal oxide particles is 0.1% by mass or more and 10% by mass or less.

8. The polishing composition according to claim 1, further comprising at least one of a dispersant and a pH adjuster.

9. A polishing method, wherein a semiconductor substrate is polished by using the polishing composition according to claim 1.

10. The polishing method according to claim 9, wherein the semiconductor substrate contains a metal layer.

11. The polishing method according to claim 10, wherein the metal layer comprises tungsten or tungsten alloy.

12. A method for producing a polishing composition according to claim 1, comprising the steps of:
measuring a full width at half maximum of a peak portion having the maximum diffracted intensity of the metal oxide particles by an X-ray powder diffraction method,
adding the metal oxide particles in which the measured full width at half maximum is less than 1° to the polishing composition as the abrasive grains.

* * * * *